United States Patent [19]

Esquivel

[11] Patent Number: 4,698,900

[45] Date of Patent: Oct. 13, 1987

[54] METHOD OF MAKING A NON-VOLATILE MEMORY HAVING DIELECTRIC FILLED TRENCHES

[75] Inventor: Agerico L. Esquivel, Dallas, Tex.

[73] Assignee: Texas Instruments Incorporated, Dallas, Tex.

[21] Appl. No.: 844,915

[22] Filed: Mar. 27, 1986

[51] Int. Cl.⁴ .................. H01L 21/70; H01L 21/76
[52] U.S. Cl. ........................... 437/52; 148/DIG. 50; 156/643; 156/653; 156/657; 437/225; 437/238
[58] Field of Search .................. 156/653, 643, 657; 357/23.5; 29/580, 576 W, 571, 591, 590; 48/1.5, DIG. 131, DIG. 50

[56] References Cited

U.S. PATENT DOCUMENTS 4,397,076 8/1983 Hanningford et al. ............... 29/591
4,612,629 9/1986 Harari ............................... 357/23.6

Primary Examiner—Brian E. Hearn
Assistant Examiner—Kevin McAndrews
Attorney, Agent, or Firm—Robert Groover, III; Leo N. Heiting; Melvin Sharp

[57] ABSTRACT

A cross point EPROM array has trenches to provide improved isolation between adjacent buried N+ bitlines at locations where the adjacent buried N+ bitlines are not separated by a FAMOS transistor. This results in improved leakage current, improved punchthrough voltage characteristics, and in improved programmability for the cell.

18 Claims, 2 Drawing Figures

METHOD OF MAKING A NON-VOLATILE MEMORY HAVING DIELECTRIC FILLED TRENCHES

BACKGROUND AND SUMMARY OF THE INVENTION

The present invention relates to integrated circuits and to methods for manufacturing them.

The present invention is an improvement on the device structure and processes taught in the following application, which is hereby incorporated by reference: Ser. No. 728,961, filed 04/30/85 (TI-10667). The present invention also provides substantial improvements when applied to other non-volatile memory cell architectures, including those which do not use a buried n+ layer.

A key idea of the present invention is that, in the process used to build such devices, the stack etch is immediately followed by (or continued as) a trench etch. That is, after the buried N+ lines under field oxide have been formed, and lines of the first polysilicon (or silicide or polycide) layer (poly 1) have been formed between and parallel to the buried N+ lines, a second polysilicon (or silicide or polycide) layer poly 2 will be deposited. The second polysilicon layer is etched with a stack etch (at least in the array of memory cells—additional patterning steps may be used to modify this sequence for the devices used in the periphery of the memory integrated circuit), and the poly 2 level will now be etched to form wordlines which are substantially orthogonal to the buried N+ bitlines. Moreover, the poly 2 etch will be performed as a stack etch, so that all portions of poly 1 except those which are covered by poly 2 will be etched away. Thus, the poly 1 plates under the poly 2 wordlines will provide the floating gates of FAMOS transistors, providing the capability for operation as a non-volatile memory.

Thus, the stack etch normally patterns more than one layer of material at a time, and will be performed by sequentially changing the flows of etchant gases used. For example, a short initialization step might be used to clear off native oxide from the top surface of the poly 2 layer, and then a silicon etch which was selective to oxide would be used to cut through the poly 2 layer, and then an oxide/nitride etch which was selective to silicon would be used to cut through the interlevel oxide/nitride between poly 1 and poly 2, and then another long silicon etch would be used to cut through the poly 1. With appropriate etch chemistries, this sequence of steps results in a poly 1/oxidenitride dielectric/poly 2 stack wherein the edges of all the layers are neatly aligned, at the desired locations of FAMOS transistors.

One teaching of the present invention is that this stack etch can be prolonged as (or followed by) a trench etch, to give greatly improved results. That is, in the stack etch sequence, after the poly 1 layer has been etched, a further short oxide etching step is used to remove the gate oxide under the poly 1, and a long silicon etch (which must be selective to oxide) is then used to etch a trench into the substrate at the exposed location. That is, after the poly 2 layer has been etched during the stack etch, the oxide/nitride etch which removes the interlevel oxide/nitride will also remove a comparable thickness from the thick oxide over the buried N+ bitlines. However, this oxide is so thick (typically several thousand Angstroms—4500 in the preferred embodiment) that no significant damage will be done to the thick oxide layer during this step. Similarly, during the oxide etch which removes the gate oxide from under the first poly level, the large thickness of the thick oxide over the bitlines will again prevent damage. This thick oxide is also exposed to the silicon etch during the etches which remove poly 1 and which etch into the substrate, but these etches can easily be made so selective to oxide that no significant damage to the thick oxide over the bitlines is incurred.

The masking material used must, of course, be durable enough to withstand the necessary etching duration without loss of linewidth control, but this too is not a practical problem.

Thus the present invention requires only a minimal addition to the existing processing sequence to fabricate the trench isolation between adjacent buried N+ bittlines. However, the advantages which result from the structure thus formed are tremendous. First, as might be expected, the leakage current between adjacent N+ buried bitlines is tremendously reduced, simply because the physical path along which leakage must occur has been greatly elongated. Secondly, the punchthrough voltage between adjacent buried N+ bitlines is also very substantially increased for similar reasons. However, a third very surprising and important advantage has also resulted from this modified processing sequence. It has been found that the cells program much faster using the trench structure taught by the present invention than in the previously developed structure using comparable geometries. The reasons for this are not entirely understood. It is believed that one cause of this effect that the capacitance of poly 1 to substrate has been reduced. That is, a general determinant of programmability is the ratio of the coupling from poly 2 to poly 1 to the coupling from poly 1 to substrate and buried n+. If the coupling of poly 1 to poly 2 can be increased, or the coupling of poly 1 to substrate decreased, signals applied to poly 2 will be able to pull the poly 1 gate over a larger voltage swing, and therefore the voltage differences between poly 1 and substrate, which cause electron injection and therefore programming, will be increased.

Thus, using the present invention, the poly 1 floating gate is still located directly over silicon substrate portions. However, the fringing capacitance at the lower corners of the poly 1 floating gate is significantly reduced (in general, fringing capacitance becomes an increasingly large fraction of the total capacitance of a conductor as the linewidth of the conductor is reduced). That is, this fringing field capacitance portion no longer has a doped silicon semiconductor portion to couple to, but instead there is merely a dielectric (the dielectric which is used to refill the trench isolation) instead of the semiconductor material which would otherwise have been present. Since the fringing field capacitance is reduced, the total coupling of poly 1 to substrate is reduced, and therefore, the relative coupling efficiency between poly 1 and poly 2 is increased, and therefore programmability is increased.

It is believed that a second reason for the very surprising advantage in programmability may be in the way that the diffusion profiles in the substrate are modified by the silicon etch which forms the trench isolation. That is, the N+ buried bitlines will normally have some additional outdiffusion during subsequent stages of processing, and the removal of the silicon material into which they could outdiffuse will necessarily affect the net dopant concentration profiles. Moreover, there may be some segregation of dopants into the deposited dielectric, either during the deposition process or afterward. Thus, the dopant concentration profiles below the buried N+ bitlines are not precisely the same in the present invention as with the structures formerly used. Note that the relevant diffusion profiles are three-dimensional profiles, and three-dimensional modeling must be used to show the full influence of the present invention.

Thus, the present invention provides very significant performance advantages at an absolutely minimal cost of increased processing, and therefore represents a substantial advantage over the crosspoint EPROM cells previously developed.

Thus, the present invention provides at least the following advantages, in addition to others mentioned in this application:

Faster programming
Programming at lower voltages
Higher punchthrough voltage between bitlines
Lower leakage between bitlines.

According to the present invention there is provided: A nonvolatile memory cell array comprising: a semiconductor body; a plurality of bitline diffusions; a plurality of wordlines which are not parallel to said bitline diffusions, said plural wordlines being respectively mutually parallel; a plurality of floating gates underlying said wordlines at locations in between said bitline diffusions, each said floating gate defining a transistor channel location substantially thereunder; a plurality of trenches in said semiconductor body, said trenches separating adjacent ones of said channel locations one from another where said channel locations are not separated by said bitline diffusions.

According to the present invention there is also provided: A non-volatile memory cell array comprising: a semiconductor body; a plurality of substantially parallel bitline insulator strips on said semiconductor body; a plurality of bitline diffusions each underlying on of said bitline insulator strips: a plurality of wordlines which are not parallel to said bitline diffusions, said plural wordlines being respectively mutually substantially parallel: a plurality of floating gates underlying said wordlines at locations in between said bitline diffusions, each said floating gate defining a transistor channel location substantially thereunder; a plurality of trenches in said semiconductor body, said trenches separating adjacent ones of said channel locations one from another where said channel locations are not separated by said bitline diffusions.

According to the present invention there is also provided: A method for fabricating a non-volatile memory array, comprising the steps of: providing a semiconductor body; forming a plurality of bitline diffusions overlaid by bitline insulators near the surface of said semiconductor body; depositing and patterning a first insulated conductive layer to form conductive strips; depositing a second insulated conducting layer; etching said second conductive layer to form wordlines which are not parallel to said bitline diffusions, while also etching away portions of said first conductive layer which do not underlie portions of said second conductive layer and also etching away portions of said semiconductor body which underlie neither portions of said second conductive layer nor portions of said bitline insulator to a depth at least half that of said bitline diffusion.

According to the present invention there is also provided: A method for fabricating a non-volatile memory array, comprising the steps of: providing a semiconductor body; forming a plurality of bitline diffusions near the surface of said semiconductor body; depositing and patterning a first insulated conductive layer to form conductive strips; depositing a second insulated conductive layer; etching said second conductive layer to form wordlines which are not parallel to said bitline diffusions, while also etching away portions of said first conductive layer which do not underlie portions of said second conductive layer and also etching away portions of said semiconductor body which underlie neither portions of said second conductive layer nor portions of said bitline insulator to a depth at least 25% that of said bitline diffusion.

BRIEF DESCRIPTION OF THE DRAWINGS

The present invention will be described with reference to the accompanying drawings, wherein:

FIG. 3 shows punchthrough voltages at bitline nominal separations of 1.25, 1.5, and 1.75 micron for memory cells (according to sample embodiments of the present invention) with trench depths of 0.75 micron and 1.25 micron, and (for comparison) for similar memories which do not have trenches according to the present invention.

FIG. 4 shows the results of SUPRA modeling of the doping concentrations resulting from one embodiment of the process of the present invention; these results suggest that the use of the trench structure reduces the electric field at the bitlines.

FIG. 5 shows variable pulse width programming data from two slices with bitline trench isolation and from two slices without trenches; these data appear to show an enhancement in programmability (relative to the non-trench) ranging from 22% at a pulse width of 1 ms to 475% at 1 microsecond, reflecting the earlier programming of the trench structure.

FIG. 6 shows data on delta $V_{TW}$ versus pulse width for three trench and two non-trench slices, which appear to indicate that the programmed state attained by the non-trench FAMOS at a gate voltage of 12.5V could be achieved by the trench FAMOS at 11V, suggesting an increase in coupling efficiency of about 12%.

DESCRIPTION OF THE PREFERRED EMBODIMENTS

Figure 1:
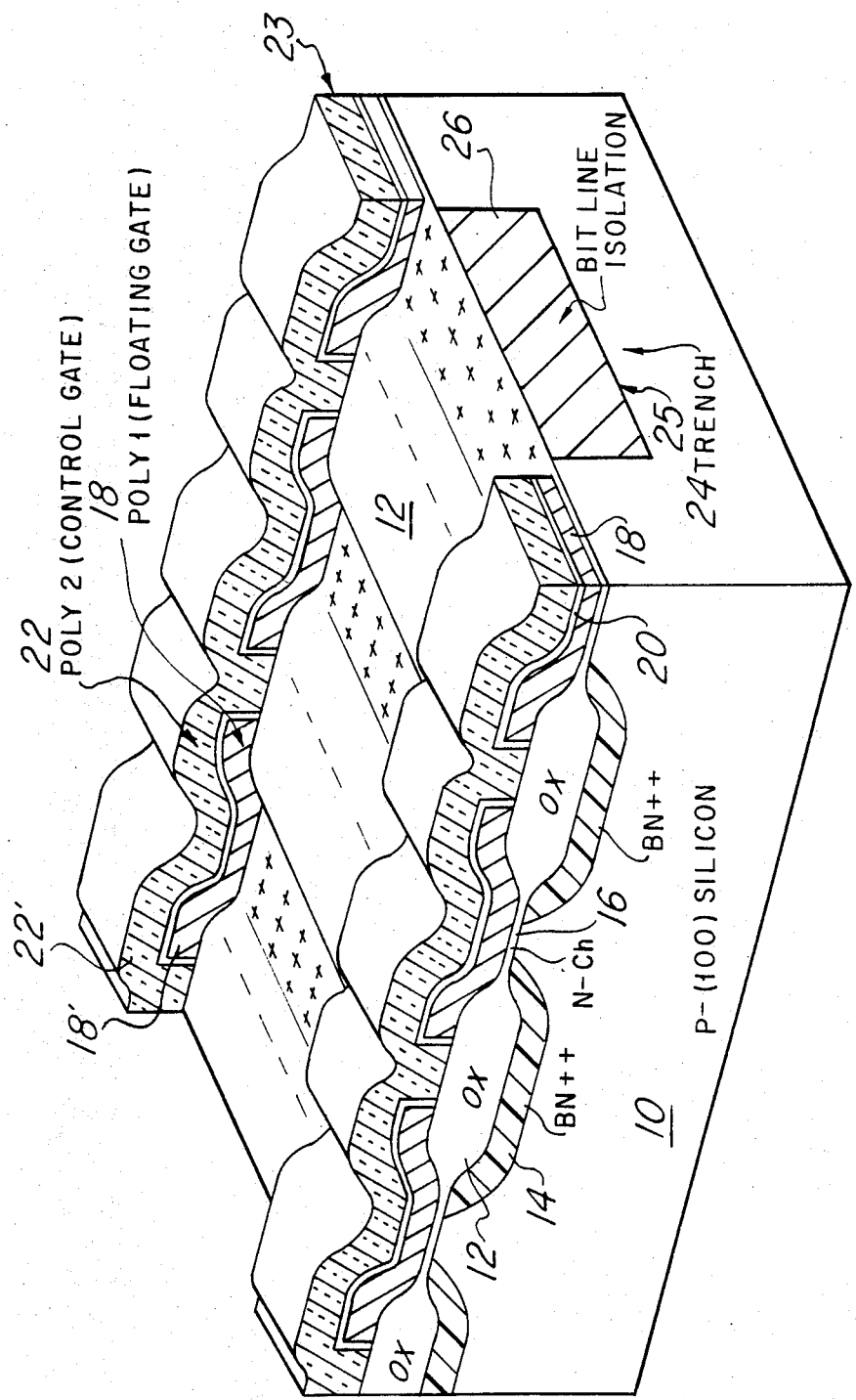
FIG. 1 shows a sample embodiment of the present invention, in an EPROM structure with buried n+ bit lines.
Figure 2:
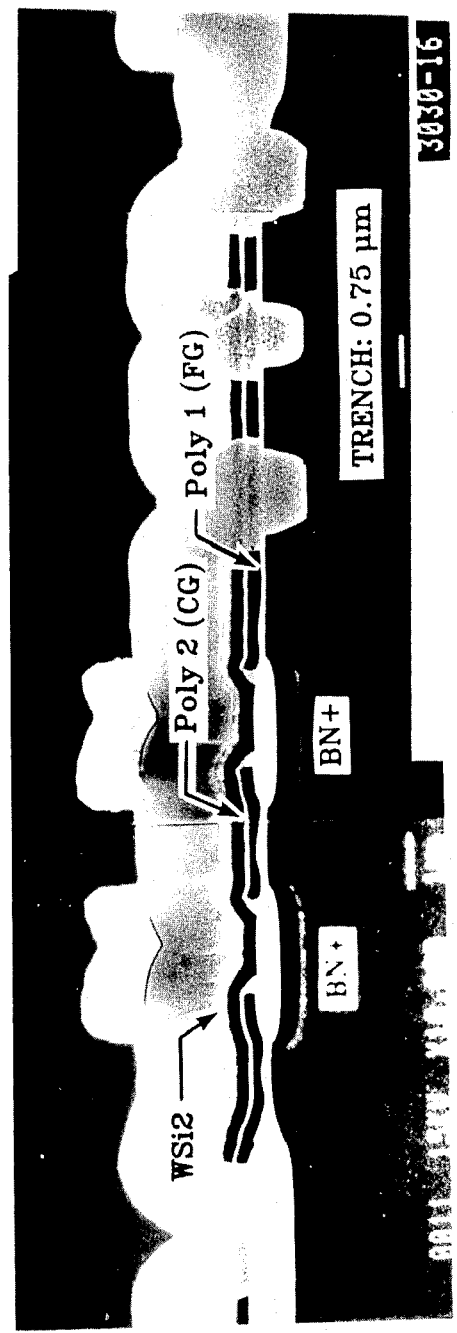
FIG. 2 shows actual electron micrographs of a sample structure according to the present invention.

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

The process flow given here is such great detail provides an EPROM with buried-n+ lines used as the source/drains of the FAMOS transistors 1. Tank formation: the following steps are used to define n-wells and p-wells for the peripheral devices:

(a) The starting material is 12-15 ohm-cm p-type epitaxial material 10, which is 12-15 microns thick and has (100) orientation, on a P+ substrate (0.01-0.02 ohm-cm).

(b) The initial oxidation is performed in steam at 900° C. to grow 350 A of oxide.

(c) 1400 A of silicon nitride is deposited by LPCVD.

(d) Photoresist is then deposited and patterned according to the tank pattern.

(e) The nitride is plasma etched according to the tank pattern.

(f) Phosphorus is implanted (at 100 keV and 6.0 E12 cm$^{-2}$) to form the n-wells.

(g) The photoresist is then stripped.

(h) A 1000° C. steam oxidation step is then performed to grow 5300 A of silicon oxide in locations not protected by the patterned nitride layer. This oxide will act as a "color reversal oxide" to define the p-well pattern as (essentially) the complement of the n-well pattern.

(i) The nitride is then stripped (in HF followed by hot phosphoric acid) to expose clean bare silicon where not protected by the color reversal oxide.

(j) Boron-11 is then implanted (at 50 keV and 3.0 E12 cm$^{-2}$) to form the p-wells.

(k) The color reversal oxide is then stripped (e.g. in 10% HF).

(l) A thin oxide is then grown overall, and the tank implants are activated and driven in, by an 1100° C. oxidation step to form 350 A of oxide, with additional heating time in an argon atmosphere.

2. Formation of moats (i.e. regions where the active devices will be formed) now proceeds.

(a) Silicon nitride (approximately Si$_3$N$_4$, although the composition may not be perfectly stoichiometric) is now deposited overall, to 1400 A thickness.

(b) Photoresist is patterned over the nitride using the MOAT pattern, to leave nitride in the regions where active devices will be formed.

(c) The exposed nitride (i.e. where the field oxide regions will be formed) is etched away.

(d) Boron-11 is implanted (100 keV, 1.0 E13 cm$^{-2}$). This will form the channel stop under the field oxide regions.

(e) The resist covering the nitride is then stripped.

(f) A 900° C. steam oxidation step is then performed to grow 9500 A of oxide, which will form the field oxide isolation regions which separate the moat regions from one another. (Note that these field oxidation regions are used only in the periphery; the self-aligned thick oxides 12 which form the bitline insulator strips over buried n+ regions in this embodiment will be formed later.)

3. The steps which form the bitline diffusions will now be described.

(a) The buried n+ pattern is defined in photoresist, to expose the locations of the bitline diffusions 14.

(b) A plasma etch is now used to clear the remaining nitride from the bitline diffusion locations.

(c) The pad oxide underlying these locations is then stripped by a dip in 10% HF.

(d) Arsenic is then implanted (50 keV. 5.0E15 cm$^{-2}$) to form the bitline diffusions 14.

(e) Photoresist is then stripped.

(f) The implanted n+ regions 14 are then annealed, and a self-aligned thick oxide 12 grown, by 100 minutes in Argon at 900° C., followed by a 900° C. steam oxidation for long enough to grow 4500 A of oxide 12 over the buried n+ regions 14 (about 40 minutes).

(g) The remaining nitride is then stripped, using a 1% HF deglaze followed by hot phosphoric acid, and the pad oxide under the nitride is also stripped using a quick dip in 1% HF.

4. The floating gates 18 of the FAMOS transistors will now be formed.

(a) A dummy gate oxidation (anti-Kooi-effect oxidation) is now performed at 900° C. in steam, to grow 350 A of oxide.

(b) Photoresist is now patterned to mask the first threshold voltage adjusting implant (V$_{TA}$-adjust), and the threshold voltages of the FAMOS transistors are adjusted by appropriate implantation.

(c) The photoresist is stripped (e.g. in H$_2$O$_2$/H$_2$SO$_4$).

(d) The dummy gate oxide is stripped in a 1% HF dip. (In this and other deglaze steps, the time in HF is preferably minimized to avoid excessive loss of the thick oxide over buried n+ (the bitline isolation oxide 12)).

(e) A first gate oxidation is now performed, e.g. at 950° C. in O$_2$+ HCl to form 350 A of oxide 16.

(f) Polysilicon is now deposited by low pressure chemical vapor deposition (LPCVD) to a thickness of 3000 A. This will form the poly 1 layer 18. This layer is doped n+ by 20 minutes in POCl$_3$ at 950° C.

(g) A short HF dip is used to minimize the native oxide thickness on this layer before patterning.

(h) Photoresist is applied and patterned according to the poly 1 pattern, to cut the floating gates 18 in the poly 1 layer 18 to approximate shape. (They will be further trimmed by the following stack etch.)

(i) An HBr/HCl plasma etch then etches the poly 1.

(j) The photoresist is stripped, by ashing followed by piranha (H$_2$O$_2$/H$_2$SO$_4$).

(k) 3000 A of oxide is then deposited by LPCVD from a vapor containing tetraethylorthosilane, and anisotropically etched to form sidewall filaments (not shown) of almost 3000 A maximum thickness.

(l) An interlevel dielectric 20 is now deposited by LPCVD in a single step at 800° C.: 150 A of oxide followed by 250 A of nitride.

(m) The interlevel dielectric 20 is now etched away in the periphery, using a mask which covers the whole array, to permit growth of the second gate oxide (which will be the gate oxide of the active devices in the periphery).

(n) Photoresist is then stripped.

5. The poly 2 layer will now be formed, to form the control gates 22 of FAMOS transistors in the array and to form gates of active devices in the periphery.

(a) A second gate oxidation step is now performed, at 900° C. in steam, to form 400 A of oxide.

(b) Boron-11 is now implanted (35 keV.5 E11 cm$^{-2}$) to adjust the thresholds of NMOS devices in the periphery.

(c) Photoresist is now patterned to expose only the channels of PMOS devices, and boron-11 is again implanted (35 keV, 9 E11 cm$^{-2}$) to adjust the thresholds of PMOS devices in the periphery.
(d) The photoresist is stripped.
(e) The poly 2 level 22 is now formed, by LPCVD deposition of polysilicon to a thickness of 3000 A, and doped to 100 ohms per square by 20 minutes in a POCl$_3$ atmosphere at 850° C.
(f) The poly 2 is now deglazed in 10% HF, and 2500 A of WSi$_2$ 23 is deposited by CVD.
(g) Photoresist is now pattened to define the gates of PMOS and NMOS devices in the pheriphery, while leaving the array protected, and the poly 2 level is etched accordingly. The remaining photoresist is then stripped.
(h) Photoresist is now patterned to define the control gates of the FAMOS transistors in the array, while leaving the periphery protected.
(i) A stock etch is now used to etch the poly 2 level 22 and 23, the interlevel dielectric 20, and the poly 1 level 18, so that the poly 1 in the array remains only as FAMOS floating gates 18, i.e. where it is covered by the poly 2 layer (and its photoresist).
(j) The stack etch is continued as a trench etch, so that the first gate oxide 16 and 3000 A of silicon substrate 10 are also etched away where not protected by the thick oxide 12 over buried n+ or by the photoresist which defines the wordline pattern in poly 2. In one sample embodiment, the trench etch is performed as
  i. A short etch to cut through the thin oxide 16 under poly 1; e.g., in a single-slice reactor, 75 sccm of He and 100 sccm of CCl$_2$F$_2$ at 0.8 Torr and 250 Watts with a substrate temperature of 15° C., for 30 seconds; followed by
  ii. a silicon etch, e.g. 180 sccm of HCl+40 sccm of HBr+80 sccm of He at a pressure of 1.3 Torr and 250 Watts power and substrate temperature of 15° C., for 100 seconds. This will produce a trench 24 with a depth of about 7500 A: for deeper for shallower trenches, the silicon etch is simply curtailed or prolonged appropriately.
(k) A bitline isolation implant (which will be self-aligned, i.e. screened by the bitline insulator strips (thick oxide 12) and by the wordlines 22 in poly 2) is now performed, e.g. boron-11 at 100 keV and 1.0 E12 cm$^{-2}$. This provides increased p-type doping in regions 25 at bottom of trenches 24.
(l) The remaining photoresist is then stripped.
(m) The WSi$_2$ of the polycide poly 2 layer can now be annealed, and a cap oxide formed on the trench sidewalls and bottom (and also on exposed portions of polysilicon), by a 1000° C. furnace operation, using 10 minutes in N$_2$ followed by 30 minutes in O$_2$.
(n) TEOS oxide 26 is now deposited and etched back to fill the trench 24.

6. Souce/drain regions in the periphery will now be formed.
  (a) A TEOS oxide is now deposited to 2500 A thickness, and etched to form sidewalls oxides.
  (b) Photoresist is now patterned to expose the source/drain regions of the NMOS devices in the periphery, and As implanted (50 keV, 5E15 cm$^{-2}$) followed by P (50 keV, 4E14 cm$^{-2}$).
  (c) Another patterned photoresist layer is now used to expose the PMOS source/drain regions, and boron-11 is implanted (40 keV, 3.0 E15 cm$^{-2}$).
  (d) The photoresist is now stripped.
  (e) A conformal oxide layer is now deposited overall, e.g. 1000 A of TEOS oxide, to prevent out-diffusion of the n+ and p+ implants in the periphery and to assist in gettering mobile ions.
  (f) The source drain implants are annealed, and the TEOS oxide densified, by a 900° C. furnace treatment (Ar for 60 minutes, then O$_2$ for 30 minutes, then Ar for 10 minutes).

7. Contacts are now formed.
  (a) The MLO is deposited: for example, a borophosphosilicate glass (BPSG) containing approxiamtely 4.5% boron and also about 4.5% phosphorus is used.
  (b) A 900° C. furnace step (30 minutes in argon) is used to densify the BPSG.
  (c) Photoresist is applied and patterned to expose the contact hole locations, the contact holes are etched, and the remaining resist is stripped. Note that this step too applies principally to the periphery: there are no contacts in the memory array, except for occasional metal to poly 2 contacts used for strapping the word lines.

8. Processing continues conventionally with metal patterning, for the peripheral devices only.
  (a) A deglaze in 1% HF is used to get good metal adhesion, and metal is then deposited by sputtering.
  (b) A dyed photoresist is deposited and patterned, the metal is plasma etched, and the resist is stripped.
  (c) The structure is heated to 450° C. in H$_2$ for 30 minutes to sinter the metal and lower its contact resistance.

9. A protective overcoat is now formed:
  (a) 4500 A of oxynitride dielectric is deposited overall by LPCVD.
  (b) The protective overcoat is covered with a patterned photoresist and etched away to expose metal at contact pad locations, and the photoreist is stripped.

10. Processing concludes with backgrind and backside gold deposition.

This flow results in a structure like that shown in FIG. 1, where adjacent FAMOS transistors are separated (normal to their direction of current flow) by a trench.

Of course, this process flow can be modified in a tremendous variety of ways. A few of the most obvious ones include use of counterdoped source/drains, use of different junction depths, use of shallower trenches, use of different substrate doping, use of different conductive materials to form the poly 1 and poly 2 levels, use of different threshold voltage adjusting implants; and a wide variety of others will be apparent to those skilled in the art. For example, the present invention is also applicable to EPROMs and EEPROMs which do not use a buried n+, but use a more conventional surface source/drain structure instead. The present invention is not limited to the particular process type given, but provides a broad concept which is applicable to a tremendous variety of floating-gate memories. The present invention is useful in ANY floating-gate memory process (or other similar process), and most especially so where a stack etch is used to pattern the control gate and floating gate simultaneously. The present invention is applicable not only to EPROMs, but also to EEPROMs and other floating gate structures.

Measurements of bitline to bitline punchthrough (defined at a leakage current density of 0.33 nA/micron) indicate a 40% improvement in punchthrough voltage (FIG. 3) relative to the non-trench values. The results also indicate that there is no marked correlation between punchthrough and the trench depths of 0.75 and 1.25 micron, nor, for the trench slices, between punchthrough and bitline spacing. These results suggest that breakdown to substrate may be the limiting factor. SUPRA modeling of the doping concentrations resulting from one embodiment of the process used gave the results shown in FIG. 4, which indicates that the use of the trench structure reduces the electric field at the bitlines.

The dependence of FAMOS programmability on pulse programming parameters was determined by correlating the change is programmed threshold voltage, delta $V_{TW}$, with: drain voltage pulse width, gate voltage, drain voltage pulse height and the number of drain voltage pulses. In all cases, significant increases in programmability were observed for FAMOS transistors with trench isolation. As an example (FIG. 5) variable pulse width data from two slices with bitline trench isolation and from two slices without trenches show an enhancement in programmbility (relative to the non-trench) ranging from 22% at a pulse width of 1 ms to 475% at 1 microsecond, reflecting the earlier programming of the trench. It has also been observed (in five slices from 2 lots) that trench isolated FAMOS transistors consistently and characteristically programmed at 400 nsec to a delta $V_{TW}$ of 0.8 to 1.2 V, whereas the non-trench FAMOS showed no programming at 400 nsec.

While the exact causes of enhanced programmability due to trench isolation are not fully known. One probably mechanism (probably only a partial cause) is the observed increase in coupling efficiency between control and floating gates. Data in FIG. 6 indicate that the programmed state attained by the nontrench FAMOS at a gate voltage of 12.5V could be achieved by the trench FAMOS at 11V, thus suggesting an increase in coupling efficiency of about 12%. Functionality in a 64K EPRON array has been demonstrated.

In the presently preferred embodiment, this structure is configured as a 1 MBIT EPROM. Literature on other contemporary EPROMs of comparable size may be found in K. Komori et al. (Hitachi), 1985 IEDM Technical Digest, pages 627–628: and K. Sekiya et al. (NEC), VLSI Symposium (San Diego, May 1986): which are both hereby incorporated by reference.

The memory thus constructed is read by raising one wordline to a voltage intermediate the threshold voltages of FAMOS transistors in "1" or "0" states, driving one bitline to a known voltage and sensing the current on a bitline adjacent to the driven bitline, to sense the stored of one cell. It is written by driving one wordline and one bitline high (while the adjacent bitline is held low), so that hot carriers can be generated at the n+ junction of the buried bitline diffusion and injected through the oxide into the poly 1 floating gate.

It should be noted that the present invention is not only applicable to EPROMs like those discussed, but also to other kinds of floating-gate memories, and specifically to EEPROMs.

Of course the polysilicon gate layer so frequently referred to in the present application does not have to be strictly polysilicon, but can be other materials which are substantially polycrystalline or amorphous and contain a large fraction of silicon; in this usage silicides and polysilicon/silicide sandwich structures are certainly comprehended, and future sandwich structures which have analogous deposition and electrical properties in future processes to the place of polysilicon in present process are intended to be comprehended also. The use of a polycide structure as the poly 2 level in the principal preferred embodiment is only one example of the range of technical possibilities here.

As will be appreciated by those skilled in the art, the present invention can be widely modified and varied, and its scope is not limited except as specified in the allowed claims.

What is claimed is:

1. A method for fabricating a non-volatile memory array, comprising
   the steps of:
   (a) providing a semiconductor body;
   (b) forming a plurality of bitline diffusions overlaid by bitline insulators near the surface of said semiconductor body;
   (c) depositing and patterning a first insulated conductive layer to form conductive strips;
   (d) depositing a second insulated conductive layer;
   (e) etching said second conductive layer to form wordlines which are not parallel to said bitline diffusions,
      i. while also etching away portions of said first conductive layer which do not underlie portions of said second conductive layer
      ii. and also etching away portions of said semiconductor body which underlie neither portions of said second conductive layer nor portions of said bitline insulator to define trenches having a depth a depth at least half that of said bitline diffusion 2. The method of claim 1, wherein said first conductive layer is not crystalline and comprises at least 30% atomic of silicon.

3. The method of claim 1, wherein said second conductive layer is not crystalline and comprises at least 30% atomic of silicon.

4. The method of claim 1, wherein said second conductive layer is polycrystalline and comprises a substantial fraction of a metal silicide.

5. The method of claim 1, further comprising the additional step, subsequent to said step (e), of
   (f) filling said trench with a dielectric material.

6. The method of claim 1, further comprising the additional steps, subsequent to said step (e), of
   (f) oxidizing sidewalls of said trench to form a passivating layer, and
   (g) filling said trench with a dielectric material.

7. The method of claim 1, further comprising the additional steps, subsequent to said step (e), of
   (f) implanting an additional dose of a dopant impurity into the bottom of said trench, and
   (g) filling said trench with a dielectric material.

8. The method of claim 1, wherein said step (c) of depositing a first insulated conductive layer comprises the preliminary substep of growing a dielectric on said semiconductor body, 9. The method of claim 1, wherein said step (c) of depositing a second insulated conductive layer comprises the preliminary substep of depositing a dielectric on said first insulated conductive layer.

10. A method for fabricating a non-volatile memory array, comprising the steps of:
(a) providing a semiconductor body;
(b) forming a plurality of bitline diffusions near the surface of said semiconductor body;
(c) depositing and patterning a first insulated conductive layer to form conductive strips;
(d) depositing a second insulated conductive layer;
(e) etching said second conductive layer to form wordlines which are not parallel to said bitline diffusions,
  i. while also etching away portions of said first conductive layer which do not underlie portions of said second conductive layer
  ii. and also etching away portions of said semiconductor body which underlie neither portions of said second conductive layer nor portions of said bitline insulator to define trenches having a depth at least 25% that of said bitline diffusion.

11. The method of claim 10, wherein said first conductive layer is not crystalline and comprises at least 30% atomic of silicon.

12. The method of claim 10, wherein said second conductive layer is not crystalline and comprises at least 30% atomic of silicon.

13. The method of claim 10, wherein said second conductive layer is polycrystalline and comprises a substantial fraction of a metal silicide.

14. The method of claim 10, further comprising the additional step, subsequent to said step (e), of
(f) filling said trench with a dielectric material.

15. The method of claim 10, further comprising the additional steps, subsequent to said step (e), of
(f) oxidizing sidewalls of said trench to form a passivating layer, and
(g) filling said trench with a dielectric material.

16. The method of claim 10, further comprising the additional steps, subsequent to said step (e), of
(f) implanting an additional dose of a dopant impurity into the bottom of said trench, and
(g) filling said trench with a dielectric material.

17. The method of claim 10, wherein said step (c) of depositing a first insulated conductive layer comprises the preliminary substep of growing a dielectric on said semiconductor body.

18. The method of claim 10, wherein said step (c) of depositing a second insulated conductive layer comprises the preliminary substep of depositing a dielectric on said first insulated conductive layer.

* * * * *